United States Patent
Xiao et al.

(10) Patent No.: US 9,865,213 B2
(45) Date of Patent: *Jan. 9, 2018

(54) SCAN DRIVER CIRCUIT FOR DRIVING SCANNING LINES OF LIQUID CRYSTAL DISPLAY

(71) Applicant: WUHAN CHINA STAR OPTOELECTRONICS TECHNOLOGY CO. LTD., Hubei (CN)

(72) Inventors: Juncheng Xiao, Guangdong (CN); Yao Yan, Guangdong (CN)

(73) Assignee: WUHAN CHINA STAR OPTOELECTRONICS TECHNOLOGY CO. LTD., Hubei (CN)

( * ) Notice: Subject to any disclaimer, the term of this patent is extended or adjusted under 35 U.S.C. 154(b) by 80 days.

This patent is subject to a terminal disclaimer.

(21) Appl. No.: 14/772,386

(22) PCT Filed: Jul. 15, 2015

(86) PCT No.: PCT/CN2015/084072
§ 371 (c)(1),
(2) Date: Sep. 3, 2015

(87) PCT Pub. No.: WO2016/192176
PCT Pub. Date: Dec. 8, 2016

(65) Prior Publication Data
US 2016/0358572 A1    Dec. 8, 2016

(30) Foreign Application Priority Data

Jun. 4, 2015 (CN) .......................... 2015 1 0304238

(51) Int. Cl.
G09G 3/3266 (2016.01)
G09G 3/36 (2006.01)
G11C 19/28 (2006.01)

(52) U.S. Cl.
CPC ......... *G09G 3/3677* (2013.01); *G11C 19/287* (2013.01); *G09G 3/3696* (2013.01);
(Continued)

(58) Field of Classification Search
None
See application file for complete search history.

(56) References Cited

U.S. PATENT DOCUMENTS

| | | | |
|---|---|---|---|
| 2016/0140926 A1* | 5/2016 | Xiao | G09G 3/3677 345/215 |
| 2016/0189648 A1 | 6/2016 | Xiao | |
| 2016/0267832 A1 | 9/2016 | Dai | |

FOREIGN PATENT DOCUMENTS

| | | |
|---|---|---|
| CN | 104078019 A | 10/2014 |
| CN | 104485079 A | 4/2015 |

* cited by examiner

*Primary Examiner* — Amr Awad
*Assistant Examiner* — Donna Lui
(74) *Attorney, Agent, or Firm* — Mark M. Friedman (57) ABSTRACT

A scan driver circuit for driving scanning lines is proposed. The scan driver circuit includes a pull-down control module, a pull-down module, a recovering control module, a recovering module, a downlink module, a first bootstrap capacitor, a constant low voltage supply, and a constant high voltage supply. The present inventive scan driver circuit has advantages of simple structure and low power consumption.

20 Claims, 6 Drawing Sheets

(52) U.S. Cl.
CPC ............... *G09G 2310/0202* (2013.01); *G09G 2310/0286* (2013.01); *G09G 2310/08* (2013.01)

SCAN DRIVER CIRCUIT FOR DRIVING SCANNING LINES OF LIQUID CRYSTAL DISPLAY

BACKGROUND OF THE INVENTION

1. Field of the Invention

The present invention relates to the field of display driving, and more particularly, to a scan driver circuit.

2. Description of the Prior Art

Gate driver on array (GOA) is a scan driver circuit fabricated on an array substrate of a conventional thin-film transistor (TFT) liquid crystal display (LCD). Scanning lines are scanned one by one adopting the GOA. The conventional scan driver circuit comprises a pull-down control module, a pull-down module, a downlink module, a recovering control module, a bootstrap capacitor, and a recovering control module.

Operating on high temperature, the scan driver circuit tends to delay and leak electricity, which affects the reliability of the scan driver circuit.

Therefore, it is necessary to provide a scan driver circuit for solving the problem occurring in the conventional technology.

SUMMARY OF THE INVENTION

An object of the present invention is to provide a scan driver circuit of which the structure is simple with high reliability for substituting for a conventional scan driver circuit of which the structure is complicated with low reliability.

According to the present invention, a scan driver circuit for driving scanning lines comprises: a pull-down control module, for receiving an previous stage scanning signal or a next stage scanning signal and generating a low-voltage-level scanning level signal at the corresponding scanning line according to the previous stage scanning signal or the next stage scanning signal; a pull-down module, for lowering a scanning signal at the corresponding scanning line according to the scanning level signal; a recovering control module, for receiving an previous stage clock signal or a next stage clock signal and generating a recovering signal at the corresponding scanning line according to the previous stage clock signal or the next stage clock signal; a recovering module, for elevating a scanning signal at the corresponding scanning line according to the recovering signal; a downlink module, for generating and sending a current stage clock signal and a pull-down control signal according to the scanning signal at the scanning line; a first bootstrap capacitor, for generating a scanning level signal with a low level or a high level at the scanning line; a constant low voltage supply, for supplying the low-voltage-level signal; and a constant high voltage supply, for supplying the high-voltage-level signal. The pull-down control module comprises a twelfth transistor, a controlling terminal of the twelfth transistor inputs a low-voltage-level scanning signal, an input terminal of the twelfth transistor inputs a next stage scanning signal, and an output terminal of the twelfth transistor is connected to the pull-down module. The recovering control module comprises a thirteenth transistor, a controlling terminal of the thirteenth transistor inputs a low-voltage-level scanning signal, an input terminal of the thirteenth transistor inputs an previous stage clock signal, and an output terminal of the thirteenth transistor outputs a recovering signal at the scanning line.

In one aspect of the present invention, the pull-down control module comprises a first transistor, a controlling terminal of the first transistor inputs a low-voltage-level scanning signal, an input terminal of the first transistor inputs the previous stage scanning signal, and an output terminal of the first transistor is connected to the pull-down module.

In another aspect of the present invention, the pull-down module comprises a second transistor, a controlling terminal of the second transistor inputs an previous stage pull-down control signal, an input terminal of the second transistor is connected to the output terminal of the first transistor, and an output terminal of the second transistor outputs a low-voltage-level scanning level signal at the scanning line.

In another aspect of the present invention, the recovering control module comprises a third transistor, a controlling terminal of the third transistor inputs the low-voltage-level scanning signal, an input terminal of the third transistor inputs the next stage clock signal, and an output terminal of the third transistor outputs a recovering signal at the scanning line. In another aspect of the present invention, the recovering module comprises a fourth transistor, a fifth transistor, a sixth transistor, a seventh transistor, and an eighth transistor. A controlling terminal of the fourth transistor is connected to the output terminal of the third transistor, an input terminal of the fourth transistor is connected to the constant low voltage supply, and an output terminal of the fourth transistor is connected to a controlling terminal of the fifth transistor, a controlling terminal of the eighth transistor, an output terminal of the sixth transistor, and an output terminal of the seventh transistor. An input terminal of the fifth transistor is connected to the constant high voltage supply, and an output terminal of the fifth transistor is connected to the output terminal of the second transistor. A controlling terminal of the sixth transistor inputs the pull-down control signal at a current stage, and an input terminal of the sixth transistor is connected to the constant high voltage supply. A controlling terminal of the seventh transistor inputs the pull-down control signal at an previous stage, and an input terminal of the seventh transistor is connected to the constant high voltage supply. An input terminal of the eighth transistor is connected to the constant high voltage supply, and an output terminal of the eighth transistor outputs a current stage scanning signal at the scanning line.

In another aspect of the present invention, the recovering module further comprises a fourteenth transistor, a controlling terminal of the fourteenth transistor is connected to the output terminal of the fourth transistor, an input terminal of the fourteenth transistor is connected to the constant high voltage supply, and an output terminal of the fourteenth transistor is connected to the controlling terminal of the sixth transistor.

In another aspect of the present invention, the recovering module further comprises a fifteenth transistor, a controlling terminal of the fifteenth transistor inputs the pull-down control signal at an previous stage, an input terminal of the fifteenth transistor is connected to the constant high voltage supply, and an output terminal of the fifteenth transistor is connected to an output terminal of the fourth transistor.

In another aspect of the present invention, the pull-down module further comprises a sixteenth transistor, a controlling terminal of the sixteenth transistor inputs the pull-down control signal at an previous stage, an input terminal of the sixteenth transistor is connected to the constant low voltage supply, and an output terminal of the sixteenth transistor is connected to an output terminal of the second transistor.

In another aspect of the present invention, the downlink module comprises a ninth transistor and an eleventh transistor, a controlling terminal of the ninth transistor is connected to an output terminal of the second transistor, an input terminal of the ninth transistor is connected to an output terminal of the eighth transistor, and an output terminal of the ninth transistor outputs the current stage clock signal. A controlling terminal of the eleventh transistor is connected to an output terminal of the second transistor, an input terminal of the eleventh transistor is connected to an output terminal of the ninth transistor, and an output terminal of the eleventh transistor outputs a current stage pull-down control signal.

In still another aspect of the present invention, the recovering module further comprises a fourteenth transistor and a fifteenth transistor. A controlling terminal of the fourteenth transistor is connected to an output terminal of the fourth transistor, an input terminal of the fourteenth transistor is connected to the constant high voltage supply, and an output terminal of the fourteenth transistor is connected to the controlling terminal of the sixth transistor. A controlling terminal of the fifteenth transistor inputs the pull-down control signal at an previous stage, an input terminal of the fifteenth transistor is connected to the constant high voltage supply, and an output terminal of the fifteenth transistor is connected to the output terminal of the fourth transistor.

In yet another aspect of the present invention, the pull-down module further comprises a sixteenth transistor, a controlling terminal of the sixteenth transistor inputs the pull-down control signal at a previous stage, an input terminal of the sixteenth transistor is connected to the constant low voltage supply, and an output terminal of the sixteenth transistor is connected to the output terminal of the second transistor.

According to the present invention, a scan driver circuit for driving scanning lines comprises: a pull-down control module, for receiving an previous stage scanning signal or a next stage scanning signal and generating a low-voltage-level scanning level signal at the corresponding scanning line according to the previous stage scanning signal or the next stage scanning signal; a pull-down module, for lowering a scanning signal at the corresponding scanning line according to the scanning level signal; a recovering control module, for receiving an previous stage clock signal or a next stage clock signal and generating a recovering signal at the corresponding scanning line according to the previous stage clock signal or the next stage clock signal; a recovering module, for elevating a scanning signal at the corresponding scanning line according to the recovering signal; a downlink module, for generating and sending a current stage clock signal and a pull-down control signal according to the scanning signal at the scanning line; a first bootstrap capacitor, for generating a scanning level signal with a low level or a high level at the scanning line; a constant low voltage supply, for supplying the low-voltage-level signal; and a constant high voltage supply, for supplying the high-voltage-level signal.

In one aspect of the present invention, the pull-down control module comprises a first transistor, a controlling terminal of the first transistor inputs a low-voltage-level scanning signal, an input terminal of the first transistor inputs the previous stage scanning signal, and an output terminal of the first transistor is connected to the pull-down module.

In another aspect of the present invention, the pull-down module comprises a second transistor, a controlling terminal of the second transistor inputs an previous stage pull-down control signal, an input terminal of the second transistor is connected to the output terminal of the first transistor, and an output terminal of the second transistor outputs a low-voltage-level scanning level signal at the scanning line.

In another aspect of the present invention, the recovering control module comprises a third transistor, a controlling terminal of the third transistor inputs the low-voltage-level scanning signal, an input terminal of the third transistor inputs the next stage clock signal, and an output terminal of the third transistor outputs a recovering signal at the scanning line.

In another aspect of the present invention, the recovering module comprises a fourth transistor, a fifth transistor, a sixth transistor, a seventh transistor, and an eighth transistor. A controlling terminal of the fourth transistor is connected to the output terminal of the third transistor, an input terminal of the fourth transistor is connected to the constant low voltage supply, and an output terminal of the fourth transistor is connected to a controlling terminal of the fifth transistor, a controlling terminal of the eighth transistor, an output terminal of the sixth transistor, and an output terminal of the seventh transistor. An input terminal of the fifth transistor is connected to the constant high voltage supply, and an output terminal of the fifth transistor is connected to the output terminal of the second transistor. A controlling terminal of the sixth transistor inputs the pull-down control signal at a current stage, and an input terminal of the sixth transistor is connected to the constant high voltage supply. A controlling terminal of the seventh transistor inputs the pull-down control signal at an previous stage, and an input terminal of the seventh transistor is connected to the constant high voltage supply. An input terminal of the eighth transistor is connected to the constant high voltage supply, and an output terminal of the eighth transistor outputs a current stage scanning signal at the scanning line.

In another aspect of the present invention, the recovering module further comprises a fourteenth transistor, a controlling terminal of the fourteenth transistor is connected to the output terminal of the fourth, transistor, an input terminal of the fourteenth transistor is connected to the constant high voltage supply, and an output terminal of the fourteenth transistor is connected to the controlling terminal of the sixth transistor.

In another aspect of the present invention, the recovering module further comprises a fifteenth transistor, a controlling terminal of the fifteenth transistor inputs the pull-down control signal at an previous stage, an input terminal of the fifteenth transistor is connected to the constant high voltage supply, and an output terminal of the fifteenth transistor is connected to an output terminal of the fourth transistor.

In still another aspect of the present invention, the pull-down module further comprises a sixteenth transistor, a controlling terminal of the sixteenth transistor inputs the pull-down control signal at an previous stage, an input terminal of the sixteenth transistor is connected to the constant low voltage supply, and an output terminal of the sixteenth transistor is connected to an output terminal of the second transistor.

In yet another aspect of the present invention, the downlink module comprises a ninth transistor and an eleventh transistor, a controlling terminal of the ninth transistor is connected to an output terminal of the second transistor, an input terminal of the ninth transistor is connected to an output terminal of the eighth transistor, and an output terminal of the ninth transistor outputs the current stage clock signal;

a controlling terminal of the eleventh transistor is connected to an output terminal of the second transistor, an input terminal of the eleventh transistor is connected to an output terminal of the ninth transistor, and an output terminal of the eleventh transistor outputs a current stage pull-down control signal.

Compared with the conventional technology, the feature of the present invention is the disposition of a pull-down control module and the disposition of a recovering control module, which not only improves the reliability of the scan driver circuit but simplifies the structure of the scan driver circuit. The scan driver circuit of the present invention can substitute for a conventional scan driver circuit of which the structure is complicated with low reliability.

These and other features, aspects and advantages of the present disclosure will become understood with reference to the following description, appended claims and accompanying figures.

DETAILED DESCRIPTION OF THE PREFERRED EMBODIMENTS

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

The invention is described below in detail with reference to the accompanying drawings, wherein like reference numerals are used to identify like elements illustrated in one or more of the figures thereof, and in which exemplary embodiments of the invention are shown.

Figure 1:
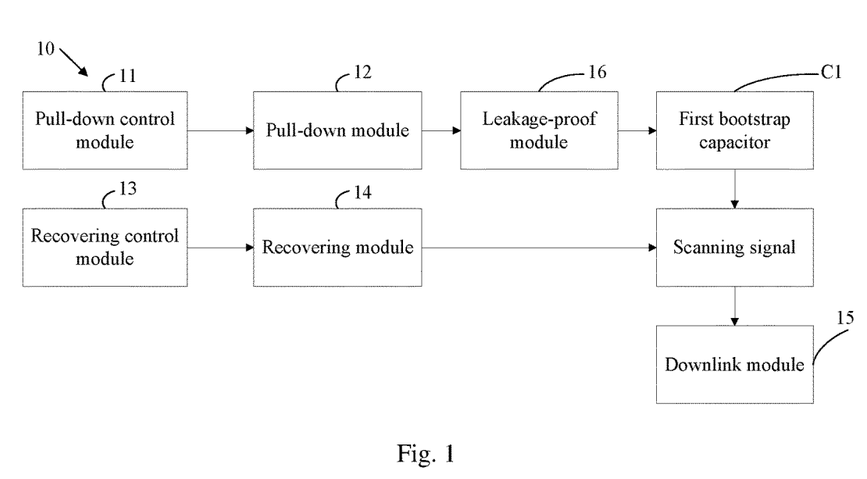
FIG. 1 shows a schematic diagram of the structure of the scan driver circuit according to a preferred embodiment of the present embodiment.

Please refer to FIG. 1 showing a schematic diagram of the structure of the scan driver circuit 10 according to a preferred embodiment of the present embodiment. The scan driver circuit 10 is used for driving scanning lines in cascade. The scan driver circuit 10 comprises a pull-down control module 11, a pull-down module 12, a recovering control module 13, a recovering module 14, a downlink module 15, a leakage-proof module 16, a first bootstrap capacitor C1, a constant low voltage supply VGL, and a constant high voltage supply VGH.

The pull-down control module 11 is used for receiving an previous stage scanning signal G_N−1 and generating a low-voltage-level scanning level signal at the corresponding scanning line according to the previous stage scanning signal G_N−1. The pull-down module 12 is used for lowering a scanning signal G_N at the corresponding scanning line according to the scanning level signal. The recovering control module 13 is used for receiving a next stage clock signal CK_N+1 and generating a recovering signal at the corresponding scanning line according to the next stage clock signal CK_N+1. The recovering module 14 is used for elevating the scanning signal G_N at the corresponding scanning line according to the recovering signal. The downlink module 15 is used for generating and sending a current stage clock signal CK_N according to the scanning signal G_N at the scanning line. The first bootstrap capacitor C1 is used for generating a scanning level signal with a low level or a high level at the scanning line. The constant low voltage supply VGL is used for supplying the low-voltage-level signal. The constant high voltage supply VGH is used for supplying the high-voltage-level signal.

Figure 2A:
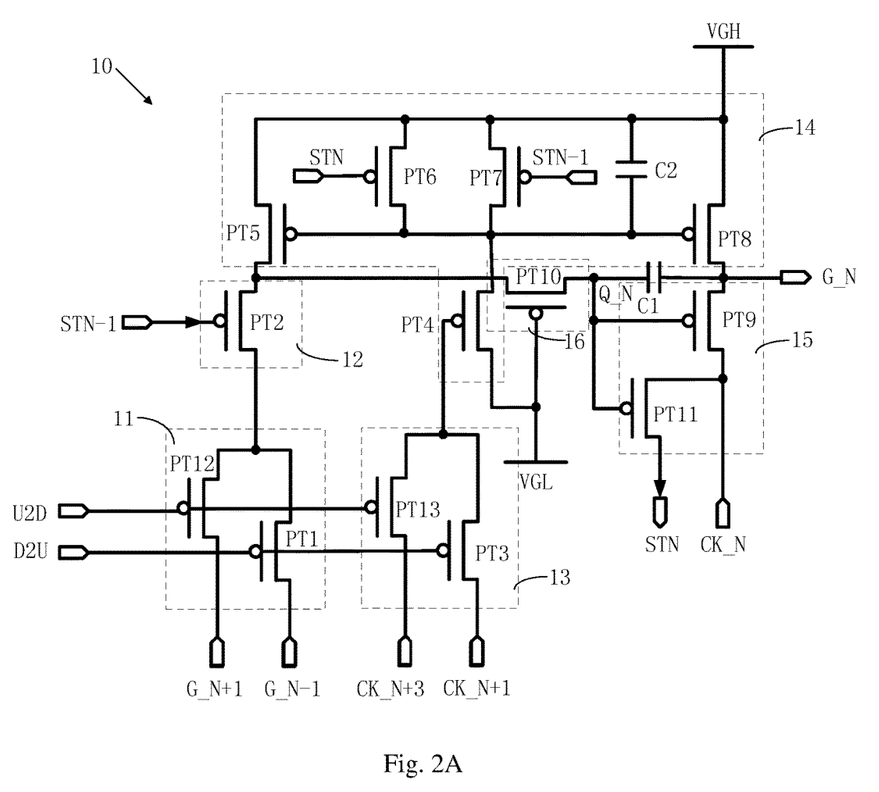
FIG. 2A is a circuit diagram of the scan driver circuit according to a first preferred embodiment of the present invention.
Figure 2B:
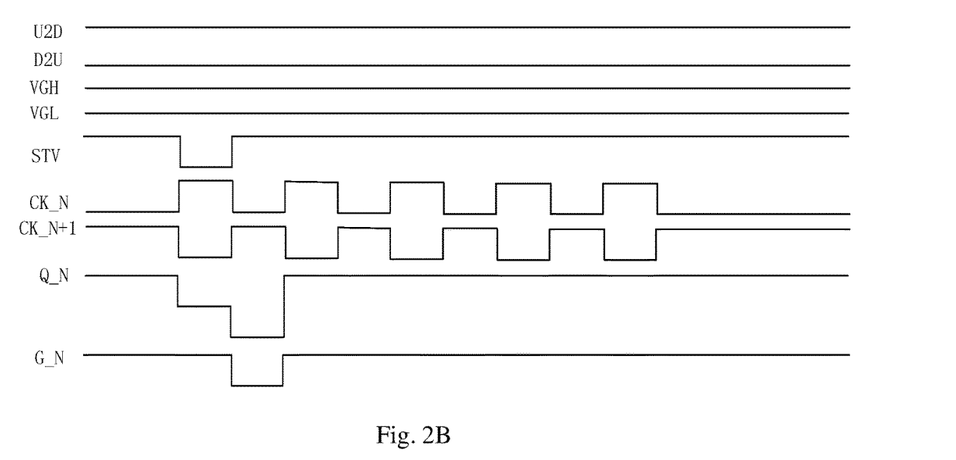
FIG. 2B shows waveforms of signals applied in the scan driver circuit according to the first preferred embodiment of the present invention.

Please refer to FIG. 2A and FIG. 2B. FIG. 2A is a circuit diagram of the scan driver circuit 10 according to a first preferred embodiment of the present invention. FIG. 2B shows waveforms of signals applied in the scan driver circuit 10 according to the first preferred embodiment of the present invention. The pull-down control module 11 comprises a first transistor PT1. The controlling terminal of the first transistor PT1 inputs a low-voltage-level scanning signal D2U. The input terminal of the first transistor PT1 inputs the previous stage scanning signal G_N−1. The output terminal of the first transistor PT1 is connected to the pull-down module 12. The pull-down module 12 outputs the previous stage scanning signal G_N−1.

The pull-down module 12 comprises a second transistor PT2. The controlling terminal of the second transistor PT2 is connected to the output terminal of the first transistor PT1. The input terminal of the second transistor PT2 is connected to the output terminal of the first transistor PT1. The output terminal of the second transistor PT2 outputs a low-voltage-level scanning signal G_N−1 at the previous stage scanning line.

The recovering control module 13 comprises a third transistor PT3. The controlling terminal of the third transistor PT3 inputs the low-voltage-level scanning signal D2U. The input terminal of the third transistor PT3 inputs the next stage clock signal CK_N+1. The output terminal of the third transistor PT3 outputs a recovering signal at a scanning line, i.e., the next stage clock signal CK_N+1.

The recovering module 14 comprises a fourth transistor PT4, a fifth transistor PT5, a sixth transistor PT6, a seventh transistor PT7, and a second bootstrap capacitor C2. The controlling terminal of the fourth transistor PT4 is connected to the output terminal of the third transistor PT3. The input terminal of the fourth transistor PT4 is connected to the constant low voltage supply VGL. The output terminal of the fourth transistor PT4 is connected to the controlling terminal of the fifth transistor PT5, the controlling terminal of the seventh transistor PT7, the output terminal of the sixth transistor PT6, and the controlling terminal of an eighth transistor PT8.

The input terminal of the fifth transistor PT5 is connected to the constant high voltage supply VGH. The output terminal of the fifth transistor PT5 is connected to the output terminal of the second transistor PT2.

The controlling terminal of the sixth transistor PT6 inputs a current stage pull-down control signal ST_N. The input terminal of the sixth transistor PT6 is connected to the constant high voltage supply VGH.

The controlling terminal of the seventh transistor PT7 inputs a previous stage pull-down control signal ST_N−1. The input terminal of the seventh transistor PT7 is connected to the constant high voltage supply VGH.

The input terminal of the eighth transistor PT8 is connected to the constant high voltage supply VGH. The output terminal of the eighth transistor PT8 outputs the current stage scanning signal G_N at the scanning line.

One terminal of the second bootstrap capacitor C2 is connected to the constant high voltage supply VGH. The other terminal of the second bootstrap capacitor C2 is connected to the output terminal of the fourth transistor PT4.

The downlink module 15 comprises a ninth transistor PT9 and an eleventh transistor PT11. The controlling terminal of the ninth transistor PT9 is connected to the output terminal of the second transistor PT2. The input terminal of the ninth transistor PT9 is connected to the output terminal of the eighth transistor PT8. The output terminal of the ninth transistor PT9 outputs the current stage clock signal CK_N.

The controlling terminal of the eleventh transistor PT 11 is connected to the output terminal of the second transistor PT2. The input terminal of the eleventh transistor PT 11 is connected to the output terminal of the ninth transistor PT9. The output terminal of the eleventh transistor PT 11 outputs the current stage pull-down control signal ST_N.

One terminal of the first bootstrap capacitor C1 is connected to the output terminal of the second transistor PT2. The other terminal of the first bootstrap capacitor C1 is connected to the output terminal of the eighth transistor PT8.

The leakage-proof module 16 comprises a tenth transistor PT10. The controlling terminal of the tenth transistor PT10 is connected to the constant low voltage supply VGL. The input terminal of the tenth transistor PT10 is connected to the output terminal of the second transistor PT2. The output terminal of the tenth transistor PT10 is connected to the output terminal of the eighth transistor PT8 through the first bootstrap capacitor C1.

Please refer to FIG. 2A and FIG. 2B illustrating a concrete operational principle of the scan driver circuit 10 according to the preferred embodiment of the present invention. The clock signal CK_N in a cycle of every two sets is output. In other words, the waveform of the clock signal CK_N and the waveform of the clock signal CK_N+2 are identical. Firstly, the previous stage scanning signal G_N−1 outputs a low-voltage-level signal. At this time, the first transistor PT1 of the pull-down control module 11 maintains conducted under the control of the scanning signal D2U at the low level. So the output terminal of the first transistor PT1 inputs the previous stage scanning signal G_N−1 to the input terminal of the second transistor PT2 of the pull-down module 12.

Meanwhile, the previous stage pull-down signal ST_N−1 also outputs a low-voltage-level signal. The second transistor PT2 and the seventh transistor PT7 are conducted. The output terminal of the second transistor PT2 outputs a low-voltage-level signal G_N−1.

The seventh transistor PT7 of the recovering module 14 is conducted. The controlling terminal of the fifth transistor PT5 and the controlling terminal of the eighth transistor PT8 are connected to the constant high voltage supply VGH through the seventh transistor PT7. So the fifth transistor PT5 and the eighth transistor PT8 are disconnected.

The tenth transistor PT10 of the leakage-proof module 16 is conducted under the control of the constant low voltage supply VGL. The low-voltage-level signal G_N−1 output by the second transistor PT2 of the pull-down module 12 works on the first bootstrap capacitor C1 through the tenth transistor PT 10, which makes the voltage level of a signal Q_N lower. Also, the scanning signal G_N outputs a low-voltage-level signal. Meanwhile, the ninth transistor PT9 of the downlink module 15 is conducted under the control of the signal Q_N. The output terminal of the ninth transistor PT9 outputs the current stage low-voltage-level clock signal CK_N to a driver circuit located at an previous stage scanning line.

The eleventh transistor PT11 is also conducted under the control of the signal Q_N. The output terminal of the eleventh transistor PT11 outputs the current stage low-voltage-level pull-down control signal ST_N. The sixth transistor PT6 is conducted under the control of the pull-down control signal ST_N. The controlling terminal of the fifth transistor PT5 and the controlling terminal of the eighth transistor PT8 are connected to the constant high voltage supply VGH through the sixth transistor PT6. So the fifth transistor PT5 and the eighth transistor PT8 keep disconnected, which makes sure that the low-voltage-level scanning signal G_N can be output and that the current leakage of the eighth transistor PT8 cannot affect the output of the low-voltage-level scanning signal G_N.

When the state of the next stage clock signal CK_N+1 turns into the low level, the third transistor PT3 of the recovering control module 13 inputs the next stage clock signal CK_N+1 under the control of the low-voltage-level scanning signal U2D. The output terminal of the third transistor PT3 outputs the clock signal CK_N+1, that is, outputting the recovering control signal to the recovering module 14.

The fourth transistor PT4 of the recovering module 14 is conducted under the control of the recovering signal. At this time, the previous stage pull-down control signal ST_N−1 turns into a high-voltage-level signal. So the seventh transistor PT7 is disconnected. At this time, the fifth transistor PT5 and the eighth transistor P18 are conducted under the control of the recovering signal. The high-voltage-level signal of the constant high voltage supply VGH is input to the Q_N point through the fifth transistor PT5, which pulls the signal Q_N up. Meanwhile, the high-voltage-level signal of the constant high voltage supply VGH is input to the scanning signal G_N, which pulls the scanning signal G_N up. Besides, the ninth transistor PT9 and the eleventh transistor PT11 are disconnected so the state of the clock signal CK_N and the state of the current stage pull-down control signal turn into the high level. The sixth transistor PT6 is disconnected under the control of the current stage pull-down control signal ST_N, which prevents the fifth transistor PT5 and the eighth transistor PT8 from being affected by the constant high voltage supply VGH.

At this stage, the process of outputting the low-voltage-level scanning signals in cascade for the scan driver circuit 10 is completed in this embodiment of the present invention.

Preferably, the disposition of the second bootstrap capacitor C2 in the recovering module 14 can pull up the level of the controlling terminal of the fifth transistor PT5 and the level of the controlling terminal of the eighth transistor PT8. Therefore, the low level of the Q_N point is guaranteed.

Preferably, the pull-down control module 11 further comprises a twelfth transistor PT12. The controlling terminal of the twelfth transistor PT12 inputs the low-voltage-level scanning signal U2D. The input terminal of the twelfth transistor PT12 inputs the next stage scanning signal G_N+1. The output terminal of the twelfth transistor PT12 is connected to the pull-down module 12. In this way, the pull-down control module 11 can receive the next stage scanning signal G_N+1 and generate the low-voltage-level scanning signal at the corresponding scanning line according to the next stage scanning signal G_N+1. Preferably, the recovering control module 13 further comprises a thirteenth transistor PT13. The controlling terminal of the thirteenth transistor PT13 inputs the low-voltage-level scanning signal U2D. The input terminal of the thirteenth transistor PT13 inputs the previous stage clock signal CK_N−1 (or CK_N+3). The output terminal of the thirteenth transistor PT13 outputs the recovering signal at the scanning line. In this way, the recovering control module 13 can receive the previous stage clock signal CK_N−1 and generate the recovering signal at the corresponding scanning line according to the previous stage clock signal CK_N−1.

Further, the scan driver circuit 10 has the function of backward scanning through the twelfth transistor PT12 and the thirteenth transistor PT13.

Preferably, the scan driver circuit 10 comprises a transistor with a P-type metal-oxide-semiconductor (MOS). The transistor with the P-type metal-oxide-semiconductor controls the pull-down control module 11, the pull-down module 12, the recovering control module 13, and the recovering module 14. It is also possible that a transistor with an N-type metal-oxide-semiconductor controls the pull-down control module 11, the pull-down module 12, the recovering control module 13, and the recovering module 14.

The pull-down control signals ST_N and ST_N−1 control the sixth transistor PT6 and the seventh transistor PT7, which makes sure that the fifth transistor PT5 and the eighth transistor PT8 keep disconnected when being charged at the Q_N point. It not only quarantines the low-voltage-level state of the Q_N point but also improves the reliability of the scan driver circuit. Also, the structure of the scan driver circuit is simplified.

Figure 3:
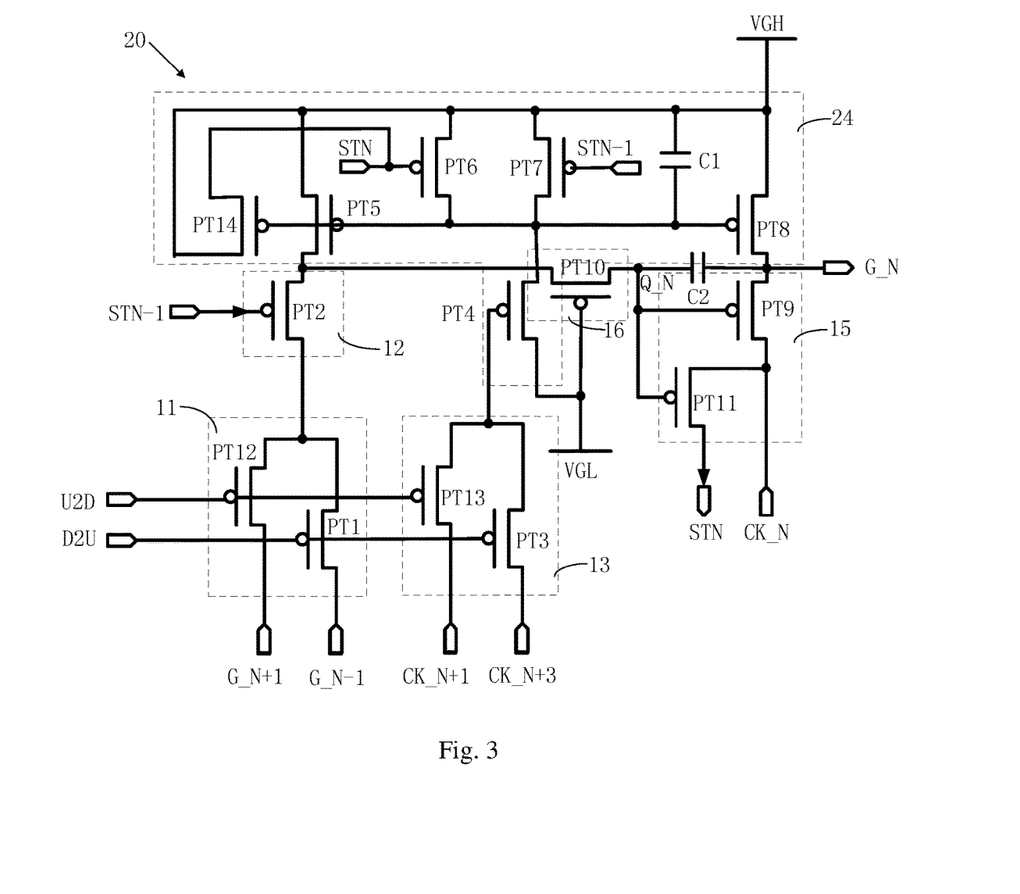
FIG. 3 is a circuit diagram of a scan driver circuit according to a second preferred embodiment of the present invention.

FIG. 3 is a circuit diagram of a scan driver circuit 20 according to a second preferred embodiment of the present invention. A recovering module 24 of the scan driver circuit 20 further comprises a fourteenth transistor PT14 based on the first preferred embodiment. The controlling terminal of the fourteenth transistor PT14 is connected to the output terminal of a fourth transistor PT4. The input terminal of the fourteenth transistor PT14 is connected to a constant high voltage supply VGH. The output terminal of the fourteenth transistor PT14 is connected to the controlling terminal of a sixth transistor PT6.

The output of the fourteenth transistor PT14 controls conduction and disconnection of the sixth transistor PT6, which prevents the sixth transistor PT6 from leaking electricity due to the instability of the pull-down control signal. Therefore, the reliability of the scan driver circuit is improved further.

Figure 4A:
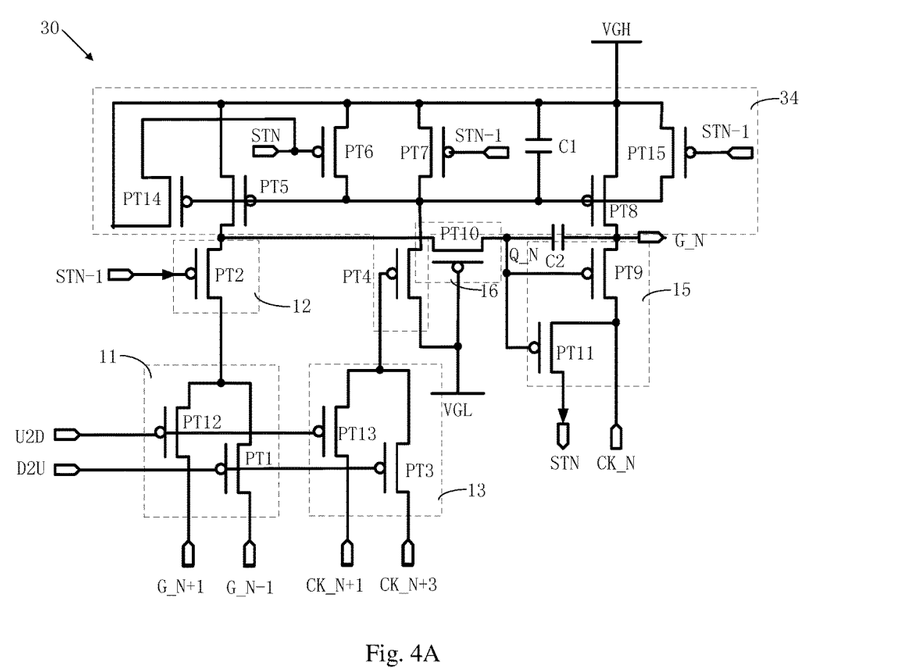
FIG. 4A is a circuit diagram of a scan driver circuit according to a third preferred embodiment of the present invention.
Figure 4B:
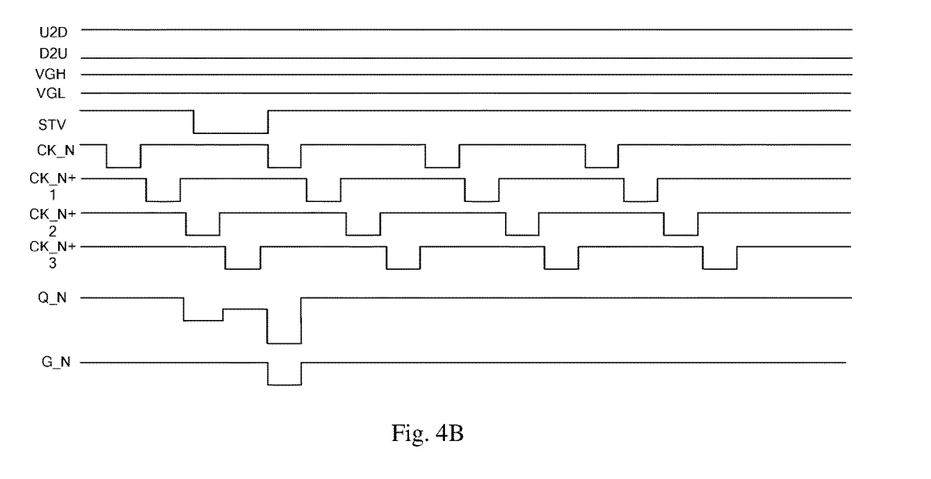
FIG. 4B shows waveforms of signals applied in the scan driver circuit according to the third preferred embodiment of the present invention.

Please refer to FIG. 4A and FIG. 4B. FIG. 4A is a circuit diagram of a scan driver circuit 30 according to a third preferred embodiment of the present invention. FIG. 4B shows waveforms of signals applied in the scan driver circuit 30 according to the third preferred embodiment of the present invention. A recovering module 34 of the scan driver circuit 30 further comprises a fifteenth transistor PT15 based on the second preferred embodiment. The controlling terminal of the fifteenth transistor PT15 inputs an previous stage pull-down control signal ST_N−1. An input terminal of the fifteenth transistor PT15 is connected to the constant high voltage supply VGH. The output terminal of the fifteenth transistor PT15 is connected to the output terminal of the fourth transistor PT4.

A clock signal CK_N in a cycle of every four sets is output. In other words, the waveform of the clock signal CK_N and the waveform of the clock signal CK_N+4 are identical. To ensure the reliability of a scanning level signal output by a second transistor PT2, the second transistor PT2 is conducted under the control of an previous stage pull-down control signal ST_N−1, and the fifteenth transistor PT15 is also conducted under the control of the previous stage pull-down control signal ST_N−1. So the disconnection of a fifth transistor PT5 and an eighth transistor PT8 is guaranteed. The low-voltage-level state of the Q_N point is guaranteed as well. Therefore, the reliability of the scan driver circuit is improved further based on the second embodiment.

Figure 5A:
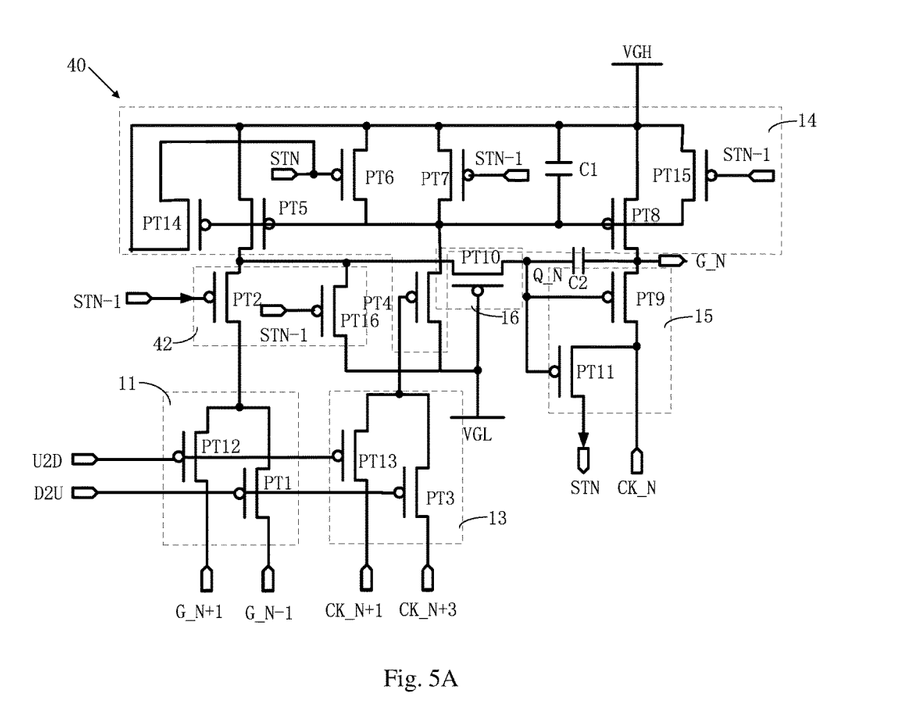
FIG. 5A is a circuit diagram of a scan driver circuit 40 according to a fourth preferred embodiment of the present invention.
Figure 5B:
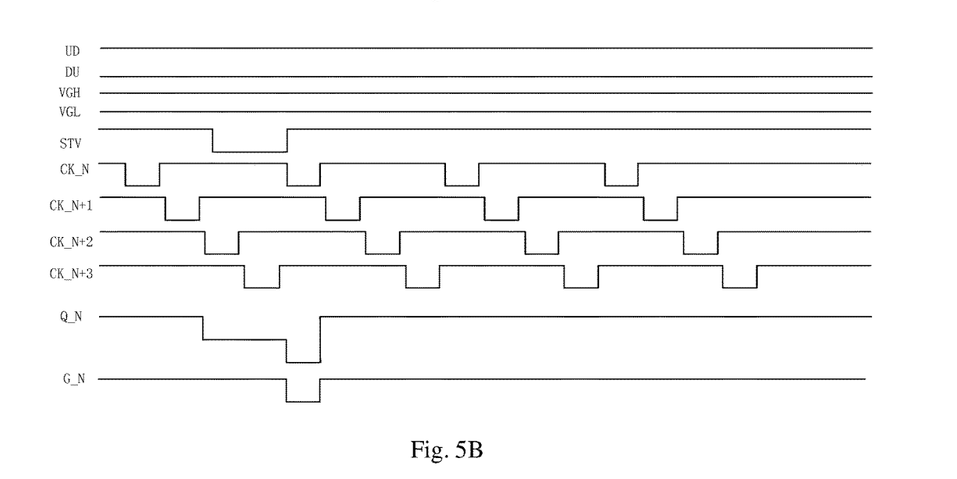
FIG. 5B shows waveforms of signals applied in the scan driver circuit 40 according to the fourth preferred embodiment of the present invention.

Please refer to FIG. 5A and FIG. 5B. FIG. 5A is a circuit diagram of a scan driver circuit 40 according to a fourth preferred embodiment of the present invention. FIG. 5B shows waveforms of signals applied in the scan driver circuit 40 according to the fourth preferred embodiment of the present invention. A pull-down module 42 of the scan driver circuit 40 further comprises a sixteenth transistor PT16 based on the third preferred embodiment. The controlling terminal of the sixteenth transistor PT16 inputs a previous stage pull-down control signal ST_N−1. The input terminal of the sixteenth transistor PT16 is connected to a constant low voltage supply VGL. The output terminal of the sixteenth transistor PT16 is connected to the output terminal of a second transistor PT2.

The level of the Q_N point of the constant low voltage supply VGL is lowered through the output of the sixteenth transistor PT16, which ensures the low-voltage-level state of the Q_N point. Therefore, the reliability of the scan driver circuit is improved further based on the third embodiment.

The scan driver circuit in each of the preferred embodiments is a single-side driver circuit in cascade. That is, every driver circuit adopts the driving signal (e.g., a scanning signal or a pull-down control signal) of its previous stage driver circuit. However, the scan driver circuit in each of the preferred embodiments can be used a dual-side driver circuit in cascade. That is, every driver circuit adopts the driving signal of its upper-two-grade driver circuit.

The feature of the present invention is the disposition of the pull-down control module and the disposition of the recovering control module, which not only improves the reliability of the scan driver circuit but simplifies the structure of the scan driver circuit. The scan driver circuit of the present invention can substitute for a conventional scan driver circuit of which the structure is complicated with low reliability.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A scan driver circuit, for driving scanning lines, comprising:
a pull-down control module, for receiving a previous stage scanning signal or a next stage scanning signal and generating a low-voltage-level scanning level signal at the corresponding scanning line according to the previous stage scanning signal or the next stage scanning signal;

a pull-down module, for lowering a scanning signal at the corresponding scanning line according to the scanning level signal;

a recovering control module, for receiving a previous stage clock signal or a next stage clock signal and generating a recovering signal at the corresponding scanning line according to the previous stage clock signal or the next stage clock signal;

a recovering module, for elevating a scanning signal at the corresponding scanning line according to the recovering signal;

a downlink module, for generating and sending a current stage clock signal and a pull-down control signal according to the scanning signal at the scanning line;

a first bootstrap capacitor, for generating a scanning level signal with a low level voltage or a high level voltage at the scanning line;

a constant low voltage supply, for supplying the low-voltage-level signal; and a constant high voltage supply, for supplying the high-voltage-level signal;

wherein the pull-down control module comprises a twelfth transistor, a controlling terminal of the twelfth transistor inputs a low-voltage-level scanning signal, an input terminal of the twelfth transistor inputs a next stage scanning signal, and an output terminal of the twelfth transistor is connected to the pull-down module;

the recovering control module comprises a thirteenth transistor, a controlling terminal of the thirteenth transistor inputs a low-voltage-level scanning signal, an input terminal of the thirteenth transistor inputs an previous stage clock signal, and an output terminal of the thirteenth transistor outputs a recovering signal at the scanning line.

2. The scan driver circuit of claim 1, wherein the pull-down control module comprises a first transistor, a controlling terminal of the first transistor inputs a low-voltage-level scanning signal, an input terminal of the first transistor inputs the previous stage scanning signal, and an output terminal of the first transistor is connected to the pull-down module.

3. The scan driver circuit of claim 2, wherein the pull-down module comprises a second transistor, a controlling terminal of the second transistor inputs a previous stage pull-down control signal, an input terminal of the second transistor is connected to the output terminal of the first transistor, and an output terminal of the second transistor outputs a low-voltage-level scanning level signal at the scanning line.

4. The scan driver circuit of claim 3, wherein the recovering control module comprises a third transistor, a controlling terminal of the third transistor inputs the low-voltage-level scanning signal, an input terminal of the third transistor inputs the next stage clock signal, and an output terminal of the third transistor outputs a recovering signal at the scanning line.

5. The scan driver circuit of claim 4, wherein the recovering module comprises a fourth transistor, a fifth transistor, a sixth transistor, a seventh transistor, and an eighth transistor;

a controlling terminal of the fourth transistor is connected to the output terminal of the third transistor, an input terminal of the fourth transistor is connected to the constant low voltage supply, and an output terminal of the fourth transistor is connected to a controlling terminal of the fifth transistor, a controlling terminal of the eighth transistor, an output terminal of the sixth transistor, and an output terminal of the seventh transistor;

an input terminal of the fifth transistor is connected to the constant high voltage supply, and an output terminal of the fifth transistor is connected to the output terminal of the second transistor;

a controlling terminal of the sixth transistor inputs the pull-down control signal at a current stage, and an input terminal of the sixth transistor is connected to the constant high voltage supply;

a controlling terminal of the seventh transistor inputs the pull-down control signal at an previous stage, and an input terminal of the seventh transistor is connected to the constant high voltage supply;

an input terminal of the eighth transistor is connected to the constant high voltage supply, and an output terminal of the eighth transistor outputs a current stage scanning signal at the scanning line.

6. The scan driver circuit of claim 5, wherein the recovering module further comprises a fourteenth transistor, a controlling terminal of the fourteenth transistor is connected to the output terminal of the fourth transistor, an input terminal of the fourteenth transistor is connected to the constant high voltage supply, and an output terminal of the fourteenth transistor is connected to the controlling terminal of the sixth transistor.

7. The scan driver circuit of claim 6, wherein the recovering module further comprises a fifteenth transistor, a controlling terminal of the fifteenth transistor inputs the pull-down control signal at a previous stage, an input terminal of the fifteenth transistor is connected to the constant high voltage supply, and an output terminal of the fifteenth transistor is connected to an output terminal of the fourth transistor.

8. The scan driver circuit of claim 7, wherein the pull-down module further comprises a sixteenth transistor, a controlling terminal of the sixteenth transistor inputs the pull-down control signal at a previous stage, an input terminal of the sixteenth transistor is connected to the constant low voltage supply, and an output terminal of the sixteenth transistor is connected to an output terminal of the second transistor.

9. The scan driver circuit of claim 5, wherein the downlink module comprises a ninth transistor and an eleventh transistor, a controlling terminal of the ninth transistor is connected to an output terminal of the second transistor, an input terminal of the ninth transistor is connected to an output terminal of the eighth transistor, and an output terminal of the ninth transistor outputs the current stage clock signal;

a controlling terminal of the eleventh transistor is connected to an output terminal of the second transistor, an input terminal of the eleventh transistor is connected to an output terminal of the ninth transistor, and an output terminal of the eleventh transistor outputs a current stage pull-down control signal.

10. The scan driver circuit of claim 9, wherein the recovering module further comprises a fourteenth transistor and a fifteenth transistor;

a controlling terminal of the fourteenth transistor is connected to an output terminal of the fourth transistor, an input terminal of the fourteenth transistor is connected to the constant high voltage supply, and an output terminal of the fourteenth transistor is connected to the controlling terminal of the sixth transistor;
a controlling terminal of the fifteenth transistor inputs the pull-down control signal at a previous stage, an input terminal of the fifteenth transistor is connected to the constant high voltage supply, and an output terminal of the fifteenth transistor is connected to the output terminal of the fourth transistor.

11. The scan driver circuit of claim 10, wherein the pull-down module further comprises a sixteenth transistor, a controlling terminal of the sixteenth transistor inputs the pull-down control signal at a previous stage, an input terminal of the sixteenth transistor is connected to the constant low voltage supply, and an output terminal of the sixteenth transistor is connected to the output terminal of the second transistor.

12. A scan driver circuit, for driving scanning lines, comprising:
a pull-down control module, for receiving a previous stage scanning signal or a next stage scanning signal and generating a low-voltage-level scanning level signal at the corresponding scanning line according to the previous stage scanning signal or the next stage scanning signal;
a pull-down module, for lowering a scanning signal at the corresponding scanning line according to the scanning level signal;
a recovering control module, for receiving a previous stage clock signal or a next stage clock signal and generating a recovering signal at the corresponding scanning line according to the previous stage clock signal or the next stage clock signal;
a recovering module, for elevating a scanning signal at the corresponding scanning line according to the recovering signal;
a downlink module, for generating and sending a current stage clock signal and a pull-down control signal according to the scanning signal at the scanning line;
a first bootstrap capacitor, for generating a scanning level signal with a low level voltage or a high level voltage at the scanning line;
a constant low voltage supply, for supplying the low-voltage-level signal; and
a constant high voltage supply, for supplying the high-voltage-level signal.

13. The scan driver circuit of claim 12, wherein the pull-down control module comprises a first transistor, a controlling terminal of the first transistor inputs a low-voltage-level scanning signal, an input terminal of the first transistor inputs the previous stage scanning signal, and an output terminal of the first transistor is connected to the pull-down module.

14. The scan driver circuit of claim 13, wherein the pull-down module comprises a second transistor, a controlling terminal of the second transistor inputs a previous stage pull-down control signal, an input terminal of the second transistor is connected to the output terminal of the first transistor, and an output terminal of the second transistor outputs a low-voltage-level scanning level signal at the scanning line.

15. The scan driver circuit of claim 14, wherein the recovering control module comprises a third transistor, a controlling terminal of the third transistor inputs the low-voltage-level scanning signal, an input terminal of the third transistor inputs the next stage clock signal, and an output terminal of the third transistor outputs a recovering signal at the scanning line.

16. The scan driver circuit of claim 15, wherein the recovering module comprises a fourth transistor, a fifth transistor, a sixth transistor, a seventh, transistor, and an eighth transistor;
a controlling terminal of the fourth transistor is connected to the output terminal of the third transistor, an input terminal of the fourth transistor is connected to the constant low voltage supply, and an output terminal of the fourth transistor is connected to a controlling terminal of the fifth transistor, a controlling terminal of the eighth transistor, an output terminal of the sixth transistor, and an output terminal of the seventh transistor;
an input terminal of the fifth transistor is connected to the constant high voltage supply, and an output terminal of the fifth transistor is connected to the output terminal of the second transistor;
a controlling terminal of the sixth transistor inputs the pull-down control signal at a current stage, and an input terminal of the sixth transistor is connected to the constant high voltage supply;
a controlling terminal of the seventh transistor inputs the pull-down control signal at a previous stage, and an input terminal of the seventh transistor is connected to the constant high voltage supply;
an input terminal of the eighth transistor is connected to the constant high voltage supply, and an output terminal of the eighth transistor outputs a current stage scanning signal at the scanning line.

17. The scan driver circuit of claim 16, wherein the recovering module further comprises a fourteenth transistor, a controlling terminal of the fourteenth transistor is connected to the output terminal of the fourth transistor, an input terminal of the fourteenth transistor is connected to the constant high voltage supply, and an output terminal of the fourteenth transistor is connected to the controlling terminal of the sixth transistor.

18. The scan driver circuit of claim 17, wherein the recovering module further comprises a fifteenth transistor, a controlling terminal of the fifteenth transistor inputs the pull-down control signal at a previous stage, an input terminal of the fifteenth transistor is connected to the constant high voltage supply, and an output terminal of the fifteenth transistor is connected to an output terminal of the fourth transistor.

19. The scan driver circuit of claim 18, wherein the pull-down module further comprises a sixteenth transistor, a controlling terminal of the sixteenth transistor inputs the pull-down control signal at a previous stage, an input terminal of the sixteenth transistor is connected to the constant low voltage supply, and an output terminal of the sixteenth transistor is connected to an output terminal of the second transistor.

20. The scan driver circuit of claim 16, wherein the downlink module comprises a ninth transistor and an eleventh transistor, a controlling terminal of the ninth transistor is connected to an output terminal of the second transistor, an input terminal of the ninth transistor is connected to an output terminal of the eighth transistor, and an output terminal of the ninth transistor outputs the current stage clock signal;
a controlling terminal of the eleventh transistor is connected to an output terminal of the second transistor, an input terminal of the eleventh transistor is connected to an output terminal of the ninth transistor, and an output terminal of the eleventh transistor outputs a current stage pull-down control signal.

\* \* \* \* \*